United States Patent [19]

Badono et al.

[11] Patent Number: 4,618,969
[45] Date of Patent: Oct. 21, 1986

[54] DIGITAL RATEMETER

[75] Inventors: Shinji Badono; Yoshikazu Tsutaka, both of Hyogo, Japan

[73] Assignee: Mitsubishi Denki Kabushiki Kaisha, Tokyo, Japan

[21] Appl. No.: 716,098

[22] Filed: Mar. 26, 1985

[30] Foreign Application Priority Data

Mar. 27, 1984 [JP] Japan .................. 59-57264

[51] Int. Cl.[4] ........................................... H03K 25/00
[52] U.S. Cl. .................................................... 377/49
[58] Field of Search ............... 377/46, 6, 10; 328/156, 328/157, 158, 136; 324/78 D, 166, 168; 364/701, 703

[56] References Cited

U.S. PATENT DOCUMENTS

| 3,311,868 | 3/1967 | Cupp et al. | 328/156 |
| 3,354,267 | 11/1967 | Crater | 328/157 |
| 3,435,196 | 3/1969 | Schmid | 364/701 |
| 4,255,793 | 3/1981 | Nakamura | 364/701 |
| 4,525,675 | 6/1985 | Richmond et al. | 328/136 |

OTHER PUBLICATIONS

A Digital Linear Ratemeter, C. H. Vincent and J. B. Bowles Nuclear Instruments and Methods, 22 (1963), pp. 201-202 and Circuit Diagram.
A Digital Decimal Pulse Ratemeter, M. Werner Nuclear Instruments and Methods, 34 (1965), pp. 103-105.

Primary Examiner—John S. Heyman
Assistant Examiner—Karl Ohralik
Attorney, Agent, or Firm—Bernard, Rothwell & Brown

[57] ABSTRACT

The invention is concerned with a digital ratemeter comprising a count difference circuit for adding input pulse signals and subtracting the frequency of the divider pulse, an integrator for integrating positive or negative count values from the count difference circuit, a feedback unit for receiving an integral count value from the integrator as input, thus generating a divider pulse frequency, and performing exponential transformation of the divider pulse frequency, whereby the integral count value is a count rate output and a fixed measurement accuracy in the overall range is attained.

6 Claims, 12 Drawing Figures

FIG. 1A (PRIOR ART)
FIG. 1B (PRIOR ART)
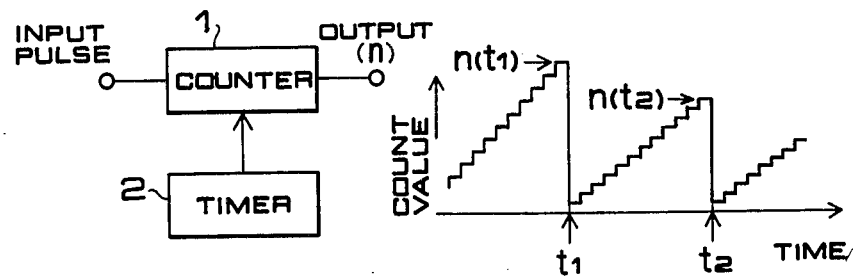
FIG. 2 (PRIOR ART)
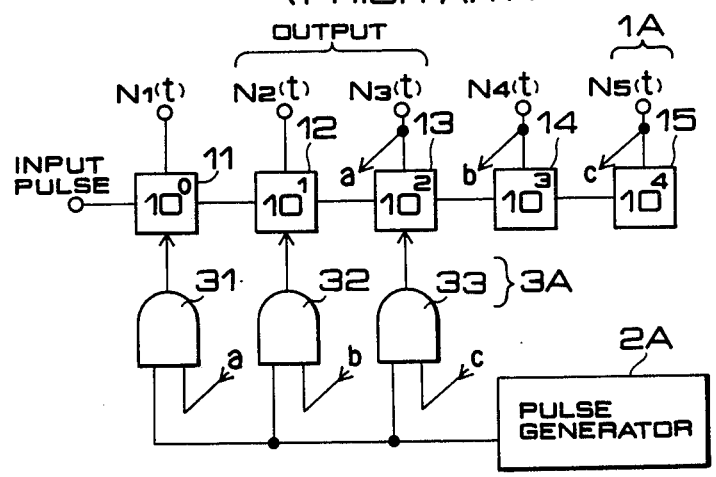

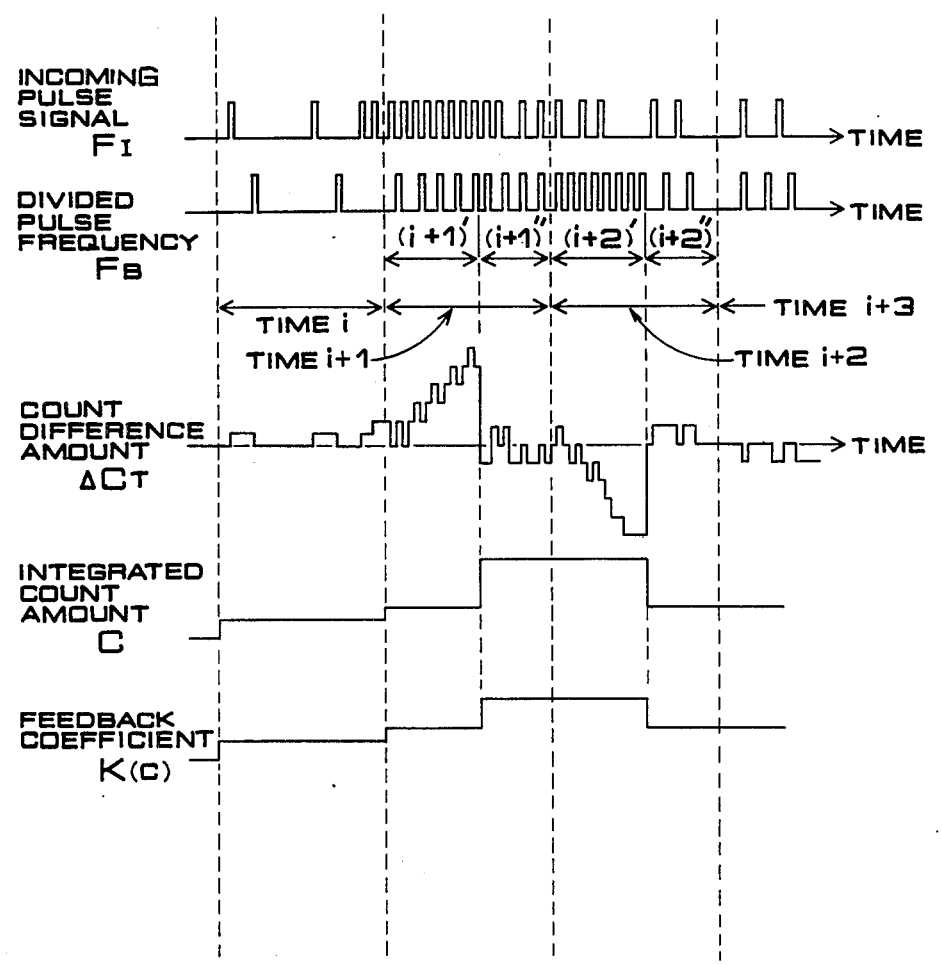

FIG. 8

| No. | Ck | M'1K | M2K |
|---|---|---|---|
| 1 | 0 | 0 | 65535 |
| 2 | 32 | 0 | 65535 |
| 3 | 64 | 32 | 32768 |
| 4 | 96 | 64 | 16384 |
| 5 | 128 | 96 | 8192 |
| 6 | 160 | 128 | 4096 |
| 7 | 192 | 160 | 2048 |
| 8 | 224 | 192 | 1024 |
| 9 | 256 | 224 | 512 |
| 10 | 288 | 256 | 256 |
| 11 | 320 | 288 | 128 |
| 12 | 352 | 320 | 64 |
| 13 | 384 | 352 | 32 |
| 14 | 416 | 384 | 16 |
| 15 | 448 | 416 | 8 |
| 16 | 480 | 448 | 4 |
| 17 | 512 | 480 | 2 |

DIGITAL RATEMETER

BACKGROUND OF THE INVENTION

1. Technical Field of the Invention

This invention relates to a digital ratemeter for counting pulse signals involving radiation events generated at random and measuring input count rate at a predetermined accuracy.

2. Description of the Prior Art

A conventional ratemeter is illustrated in FIG. 1, in which reference numerals 1 and 2 designate a counter and a timer providing starting or stopping signal to the counter 1, respectively.

Another ratemeter of the same type is shown in FIG. 2, in which a reference numeral 1A designates a group of counters consisting of five connected in cascade counters: the first, second, third, fourth and fifth digit counters to which reference numerals 11, 12, 13, 14 and 15 are allocated, respectively. Further reference numerals indicate as follows: 2A a pulse generator which generates reference time pulse, 3A a group of subtraction inputting elements; 31 a first digit subtraction input element which receives an output a of the third digit counter and an output signal from the pulse generator 2A, and delivers the subtraction output to the first counter; 32 a second digit subtraction inputting element which receives an output b of the fourth counter and an output signal from the pulse generator 2A and delivers the subtraction output signal to the second counter; and 33 a third digit subtraction element which receives an output c of the fifth counter and an output signal from the pulse generator 2A and delivering the subtraction output to the third counter.

The mode of operation will be described below. The counter 1 counts pulses incoming at random during a fixed time. The condition under which the counter 1 starts counting is fulfilled by the delivery of pulse signals output from the timer 2 by repeated oscillation of it to the reset input of the counter 1. The interval of pulse generation by the timer 2 is preset to T seconds. The counting pattern of the counter 1 is illustrated in FIG. 1(B) as the dependence of count value on time lapse. Thus, an average value N (cps) of the count rates in FIG. 1(A) is obtained in the process reading out count value (n) by an external device (not shown) directly before every resetting, and then applying to the count value a predetermined arithmetical operation by the use of a counting time period T seconds. For example in FIG. 1(B), count value $n(t_1)$ is found at time $t_1$ and count value $n(t_2)$ at time $t_2$, and the rates at both times are expressed, respectively, as $$N(t_1)=n(t_1)/T, \quad N(t_2)=n(t_2)/T \tag{1}$$

The above-mentioned ratemeter executes repeatedly continual counting and outputs count rates intermittently.

The operational mode of another prior art ratemeter is diagrammed in FIG. 2.

The group of counters 1A serves for counting input pulse signals incoming at random. The counter is a decimal 5 digits counter composed of five connected in cascade decimal counters, each being constructed with a N-bit binary counter giving $2^N$ representation as a basic element. The first digit counter 11 shown counts (pulses output from) an input pulse generator 2A, and subtracts the count value of the third digit counter 13 at a fixed time intervals synchronously with output pulses of the pulse generator 2A. Also the above-mentioned first digit counter 11 outputs count value $N_{1(t)}$ changing (increasing or decreasing) every moment as decimal first-digit count value $N_{1(t)}$, and delivers a carry signal to the input of the next higher or second digit counter when the count value $N_{1(T)}$ amounts to 10. The second and third digit counters 12, 13 operate in the same way as the first digit counter 11. The fourth- or fifth-digit counter 14 or 15 does not receive subtraction counts from the higher digit counter but performs only counting of overflow signals from the lower digit counter. In this way, count values $N_{1(t)}$, $N_{2(t)}$, $N_{3(t)}$, $N_{4(t)}$ and $N_{5(t)}$ are observed at time t on the concerned counters. The output count rate $N_{(t)}$ is expressed as $$N_{(t)}=\{N_{1(t)}+10^1\times N_{2(t)}+10^2\times N_{3(t)}+10^3\times N_{4(t)} +10^4\times N_{5(t)}\}/Te \tag{2}$$

wherein Te is average equivalent integral time in seconds.

In the example diagrammed in FIG. 2, count rate is represented by a decimal t-digits and 1/100 of count value is subtracted every T seconds, hence output count rate per equivalent integral time Te is continuously read-out. Of the prior art digital ratemeters designed, the one illustrated in FIG. 1 has disadvantages of continuous and iterative counting operation and the resulting intermittent rate output. The other illustrated in FIG. 2 accomplishes continuous counting and rate output, but has drawback of wide-range input count rate and inevitable complication of system to attain necessary accuracy.

SUMMARY OF THE INVENTION

It is the principal object of the invention to remove the above-mentioned defects or disadvantages and to provide a digital ratemeter comprising:

(A) a count difference circuit for adding input pulse signals, subtracting frequency of divider pulse and accumulating pulse count values every unit time;

(B) an integrator for receiving and integrating the positive or negative numbers of accumulated pulse counts of the count difference circuit; and (C) a feedback unit consisting of a converter for converting integral count value of the integrator into frequency division ratio and a frequency divider for submultiplying the reference pulse frequency from reference pulse generator in dependence on the frequency division ratio output of the converter and generating a divider pulse, and adapted for transforming the divider pulse by the use of exponential function of the integral count value and delivering the transformed result;

whereby a fixed measurement accuracy in the overall count rate range is attained.

BRIEF DESCRIPTION OF THE DRAWINGS

FIG. 1(A) is a block diagram showing a prior art digital ratemeter;

FIG. 1(B) is a graph of rate output against elapsed time of the same ratemeter;

FIG. 2 is a block diagram showing another prior art digital ratemeter;

FIG. 8 is a Table listing conversion coefficients of $M'_{1k}$ and $M_{2k}$ stored on storage members in the converter.

DETAILED DESCRIPTION OF THE PREFERRED EMBODIMENTS

The invention is described more fully by way of an embodiment with reference to the accompanying drawings.

Figure 3A:
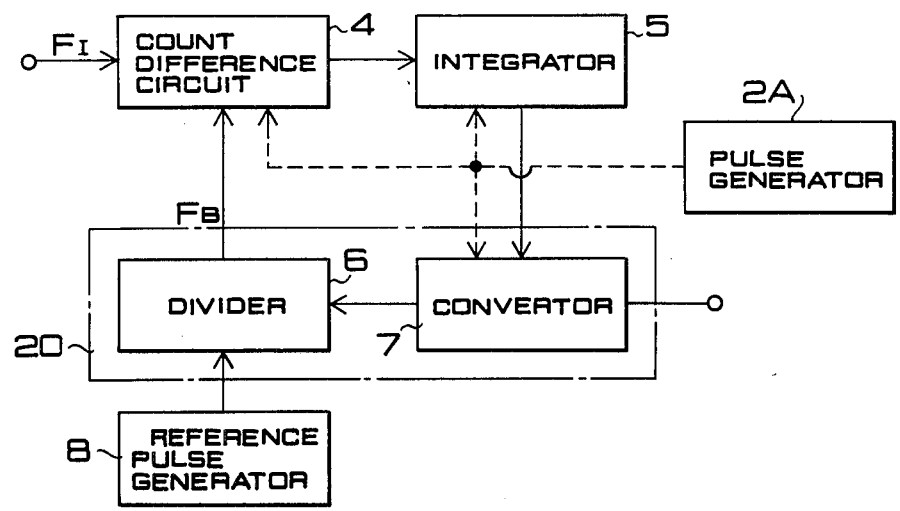
FIG. 3(A) is a block diagram illustrating a digital ratemeter embodying the invention.

In FIG. 3(A), parts or components correspondent to those in FIG. 2, are designated by the same reference numerals as in FIG. 2. Reference numeral 4 indicates a count difference circuit which makes addition counting of input time series pulse signals $F_1$ and subtracts divider pulse, $F_B$, from the count value, 5 an integrator for receiving and integrating count variation of the count difference circuit 4 over a fixed time by the action of time pulses from the pulse generator 2A, and in the case when amount of counts of the count difference circuit 4 has reached the maximum capacity count value, 7 a converter caused to operate by the action of time pulses from the pulse generator 2A and adapted for converting the integral count from the integrator 5 into count rate quantity or frequency division ratio in accordance with a preset processing procedure for conversion, while referring to the stored table, 6 a frequency divider which receives periodic pulse signals from a reference pulse generator 8 as reference input signal and count rate quantity signal from the converter 7 as control input and delivers divider pulse signal or frequency $F_B$. The converter 7 and frequency divider 6 are combined to constitute a feedback unit 20.

The mode of operation will be described with reference to FIG. 3(A) hereinafter:

The count difference circuit 4 makes addition counting while receiving incoming input time series pulse signals $F_I$ during a unit time period of $\Delta T$ seconds and simultaneously carriers out subtraction while inputting the divider pulse frequency $F_B$. The number of pulses accumulated in the count difference circuit 4 by the addition counting and subtraction, $\Delta C_T$, is at $\Delta T$ seconds' intervals, delivered to the succeedingly-connected integrator 5 and there integrated. Then, when the frequency of the input time series pulse signal $F_I$ is higher than the divider pulse frequency $F_B$, the number of accumulated pulses is $+\Delta C_T$ and, when lower, it is $-\Delta C_T$. Thus the integrator 5 makes addition or subtraction every $\Delta T$ seconds, and the integral is C counts. Now, assuming that when input time series pulse signal $F_B$ is $F_{Ii}$ (cps), and divider pulse frequency is $F_{Bi}$ (cps), the number of accumulated pulses is $-\Delta C_{Ti}$, then $$\Delta C_{Ti} = F_{Ii} \cdot T - F_{Bi} \cdot T \text{ (counts)} \tag{3}$$

Also integrated count quantity $C_i$ in the integrator 5 is expressed as $$C_i = \sum_{n=-\infty}^{i} \Delta C_{Tn} \text{ (counts)} \tag{4}$$

The integrated count quantity $C_i$ is delivered to the feedback 20, that causes the generation of the divider pulse frequency $F_{Bi}$. If the conversion coefficient correspondent to the integral count value of $C_i$ is $K_i$, then the divider pulse frequency $F_{Bi}$ is given by $$F_{Bi} = K_i \cdot C_i \text{(cps)} \tag{5}$$

The divider pulse frequency $F_{Bi}$ is a submultiple of the reference frequency $F_S$ from reference pulse generator 8 through the action of the frequency divider 6. Thus, of the conversion coefficient $K_i$, submultiple rate by the divider is $$\frac{F_{Bi}/F_S}{C_{Ti}}.$$

Besides, the count difference circuit, integrator 5 and converter 7 operate iteratively at intervals of an unit time of $\Delta T$ seconds synchronously with pulse signals delivered from the pulse generator 2A.

As the result, divider pulse frequency $F_{Bi}$ operates so as to be equal to the input time series pulse signal $F_{Ii}$ so that $F_{Bj}$ and $F_{Ij}$ come to equilibrium to each other at time j when a fixed time (Te seconds) elapsed. When the input time series pulse signal $F_I$ changes, divider pulse frequency $F_B$ is caused to operate in accordance with this. The responsive change is expressed by formula (6).

$F_{Bi} = K_i \cdot C_i$, so, formula (3) becomes $$C_{Ti} = F_{Ii} \cdot \Delta T - k_i \cdot C_i \cdot \Delta T \, (\Delta C_{Ti}/\Delta T + K_i C_i) = F_{Ii}$$

$$C_i = \frac{1}{K_i + S} \cdot F_{Ii} \text{ (counts)} \tag{6}$$

wherein S is differential operator.

Formula (6) is the primary lag and so the elapsed time Te seconds may be smooth time constant of $1/K_i$ seconds.

Figure 3B:
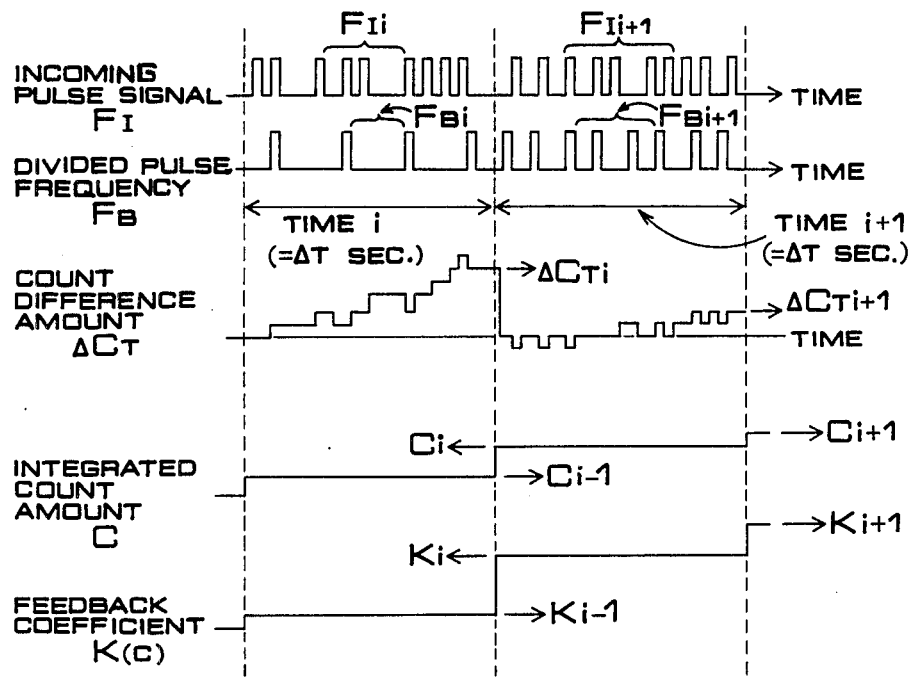
FIGS. 3(B) and (C) show operational waveforms of the digital ratemeter diagrammed in FIG. 3(A)

The operational mode of the FIG. 3(A) ratemeter is further described with reference to the waveform of FIG. 3(B).

During $\Delta T$ seconds, the frequency of input pulse signal $F_I$ applied to the count difference circuit 4 is added, and divider pulse frequency $F_B$ is subtracted, thus $C_{Ti}$ being obtained at time i as the count difference quantity, $\Delta C_T$. This is applied to the integrator 5, resulting in $C_i$ ($=C_{i-1}+\Delta C_{Ti}$) Then, the count difference circuit is caused to be zerocleared. At the same time, from the $C_i$ value and feedback coefficient value $K_i$, a new divider pulse frequency $F_{Bi}+1$ ($=C_i \times K_i$) is generated.

During the period of T seconds at time $i+1$, the same series of operations as at time i is repeated.

Besides, irregular pulse input as in radiation event can be subjected to smoothing by providing delay time Te. In this case, the relationship among the input time series pulse signal $F_I$(cps), smoothing time constant $1/K$ second (the above-mentioned $1/K_i$ is referred to as $1/K$, hereinafter), and the statistical relative count error ($\sigma$) is expressed as $$\sigma = (2F_1/K)^{-\frac{1}{2}} \tag{7}$$

For securing a certain measurement (or statistical) accuracy $\sigma_n(\%)$ of input count rate over a wide range, formula (7) results under the equilibrium condition:

$$F_I = F_B, \text{ in } 2\sigma^2 \cdot F_B = dF_B/dC, \text{ where } K = dF_B/dC, \text{ thus } F_B = \alpha \cdot \text{EXP}(2\sigma^2 \Delta C) \quad (8)$$

wherein $\alpha$ is a constant.

This indicates divider pulse frequency may be transformed by the exponential function of integral count value, and delivered.

As described above, the ratemeter according to the invention illustrated in FIG. 3(A) can be available by suitably setting the conversion coefficient of the converter 7 in two types:

(1) Constant $\tau$ type: Response time constant is independent of the variation of input time series pulse signal.

(2) Constant $\sigma$ type: Statistical count error is independent of change in input time series pulse signal.

For (1) the constant $\tau$ type, the relationship between count value C and divider pulse $F_B$ (cps) is given by $$F_B = K \cdot C \text{ (cps)} \quad (9)$$

After the equilibrium of the divider pulse frequency $F_B$ with input time series pulse signal $F_I$ has been established, it follows that $F_B = F_I$. Hence, over the overall range of input time series pulse signal $F_I$, constant $K_O$ is added to the conversion coefficient, and a constant response time constant is obtainable. For (2) constant $\sigma$ type, the conversion coefficient is $K(c)$, and, when integral count value is Cn, kn is given as conversion coefficient in the narrow range of variation: $\Delta C$, $$F_I = kn \cdot Cn + K_O \quad (10)$$

In this case, it is assumed that the conversion coefficient over the entire range of input count rate, $K(c)$, is approximate to formula (8).

Figure 4:
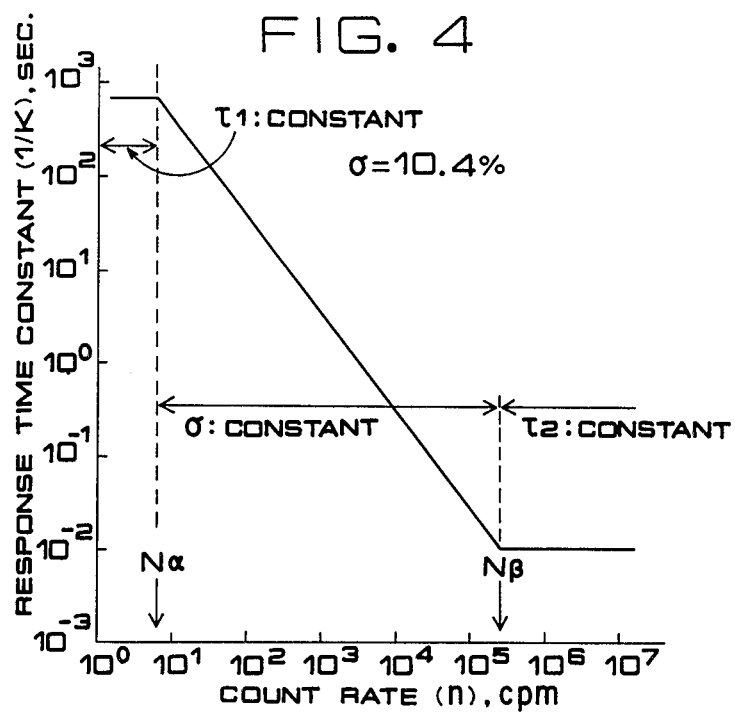
FIG. 4 is a graph giving characteristic of count rate against time constant.

A preferred embodiment according to the invention can realize the input time series pulse signal time constant ($F_I$—Te) characteristic graphed in FIG. 4 as the result of combination of the constant $\tau$ type and the constant $\sigma$ type. As apparent from FIG. 4, out of the count rate range (n) between $10^0$ and $10^7$ (cpm), the range between $10^0$ to $N_\alpha$(cpm) corresponds to the constant $\tau_1$ area, the range between $N_\alpha$ and $N_\beta$ (cpm) to the constant $\sigma$ area, and the range between $N_\beta$ and $10^7$ (cpm) to the constant $\tau_2$ area. $\tau_1$ amount to 805 seconds and $\tau_2$ to 20 m seconds. The count rate is favorable to be obtained at a constant accuracy in the overall measurement range. It is important for practical use, particularly to prevent lag time involving response time constant in the range of constant $\tau_1$ area, and to check unnecessary high speed response and secure stable feedback operation in the range of constant $\tau_2$. The feature of the method realized according to the invention, as later described, resides in the frequency divider 6 and converter 7 which are components of the system diagrammed in FIG. 3(A).

Thus, the embodiment according to the invention attains, on the combination of the fundamental construction diagrammed in FIG. 3 and the principal characteristic graphed in FIG. 4, the following count rate performances:

(1) The range of input time series pulse signal $F_I$ amounts to 7 digits without using range switching means (2) Maximum input time series pulse signal $F_I$ of 200 Kcps is measurable, and (3) The instrument responds well to fast change in input time series pulse signal $F_I$.

As means for achieving these, there are furnished three features:

Firstly, the count difference circuit 4 is provided with a predetermined count capacity, or should be one having count capacity of accumulating incoming pulses per unit time.

Integrator 5 and the count value/frequency division ratio converter 7 are caused to operate for sampling periodically at intervals of $\Delta T$ seconds by the action of the pulse generator 2A and the count difference circuit 4 would be enabled to count all input pulses by providing it with a suitable count capacity.

The count capacity $C_v$ is with maximum input count rate $f_{max}$ (cps) and unit time $\Delta T$ seconds, expressed as $$C_v = l \cdot \sqrt{f_{max} \times \Delta T}$$

wherein l is termed "allowance coefficient". For example, if $f_{max} = 200$ Kcps, $\Delta T = 10$ m seconds and $l = 3$, then $C_v = 2^6$. Thus, using a 8 bit addition/subtraction device as the count difference circuit 4, the capacity amounts to $\pm 2^6$.

Input pulse signals are inherently accompanied by statistical variation in incoming frequency, and so, owing to the increase in count capacity represented by the allowance coefficient l: the count capacity l times more than the standard deviation at maximum input time, operation beyond the increased count capacity cannot occur in normal state.

The second feature resides in that when the input pulse signal ($F_I$) changes suddenly widely, overflowing of the count difference circuit 4 occurs.

When the input time series pulse signal $F_I$ changes suddenly, the count difference circuit 4 overflows within $\Delta T$ seconds, and simultaneously delivers to the integrator 5, then the driver pulse frequency $F_B$ is caused to change. That is:

The count difference circuit 4 is so constructed that it causes the generation of carry and borrow signals when count quantity accumulated during unit time gets beyond the positive or negative counting capacity, and thereby provokes the succeedingly-connected integrator to nonperiodically operate for accumulation.

The mode is described referring to the waveforms shown in FIG. 3(C). During time i+1, the positive count value of the count difference circuit 4 will go beyond its positive capacity within $\Delta T$ seconds.

Then, when carry signal is generated, it is added to the integrator and the count difference circuit is zero-cleared, renewal of divider pulse frequency is made in time (i+1)'.

During time i+2, upon negative count capacity is exceeded in (i+2)'', borrow signal is delivered and the series of operations above-mentioned is accomplished.

The third feature is realization of speed up of conversion expressed by formula (8).

Input time series pulse signal $F_I$ of high count rate and a wide range, requires the operation of the converter 7 to be high speed, so that program computing by an arithmetic operation unit or high speed arithmetic operation by computational IC element is improper to be applied to the conversion according to formula (8) because time taken for executing computation is more than m seconds. For this reason, as further feature of the present invention, there is furnished with a storage element on which a small number of conversion coefficients was previously stored a processing means making a simple operation for judgement, thereby to enable the converter 7 to attain the above-mentioned preformance.

Figure 5:
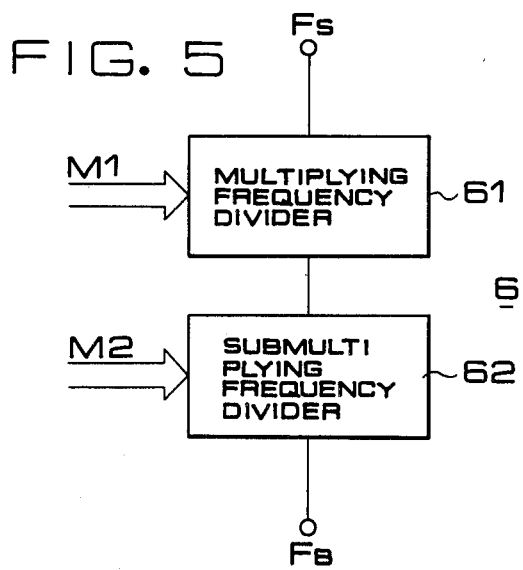
FIG. 5 is a block diagram of a frequency-division circuit consisting of a multiplying frequency-divider and a submultiplying frequency divider.

Both methods of providing a count coefficient and frequency division by the use of the feedback unit 20 involving the invention consisting of the converter 7 and frequency divider 6 will be described below:

The construction of the frequency divider 6 is diagrammed in FIG. 5. It consists of a multiplying and submultiplying frequency dividers 61 and 62 connected in series as shown. The former generates output signal having a frequency multiplied depending on the increase in the first conversion coefficient value $M_1$ (which can be picked up from storage Table in FIG. 8), and the latter generates output signal having a frequency submultiplied depending on increase in the second conversion coefficient value $M_2$ which can be picked up from storage Table in FIG. 8. In particular, the reciprocal of $M_2$ is taken.

For example, if acceptable staistical error=10.4%, unit time T=10 m seconds, reference frequency $F_B$ (max)=200 Kcps, and the number of bits of the frequency divider=28 bits (12 bits for multiplication, 16 bits for submultiplication), then series of the first and second conversion coefficient value $M_{1k}$ and $M_{2k}$, respectively, provided to the storage element of the converter 7 are as listed in FIG. 8.

Figure 6:
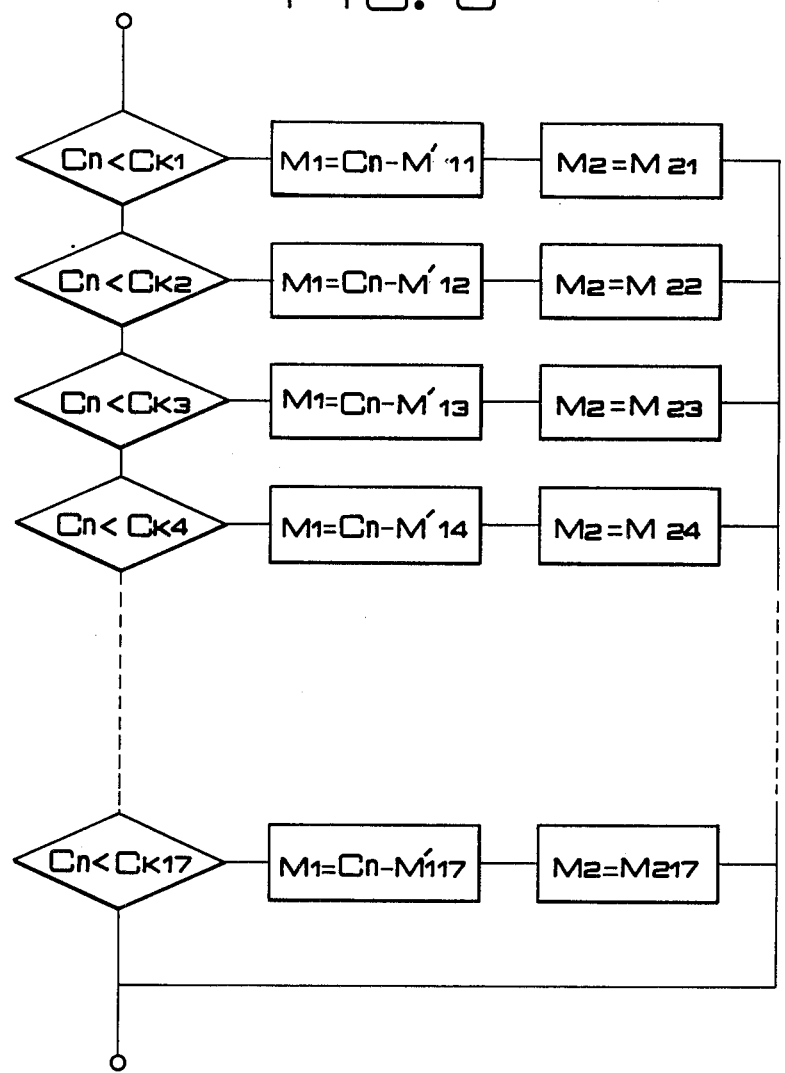
FIG. 6 is a flow chart giving the conversion procedure of a converter.
Figure 7A:
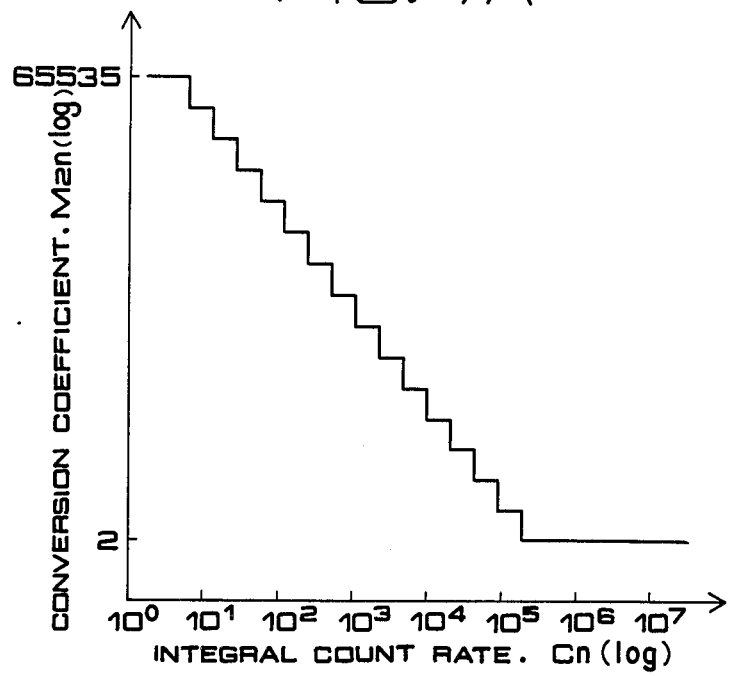
FIGS. 7(A) and (B) are graphs showing integral rate-conversion coefficient characteristic of the converter.
Figure 7B:
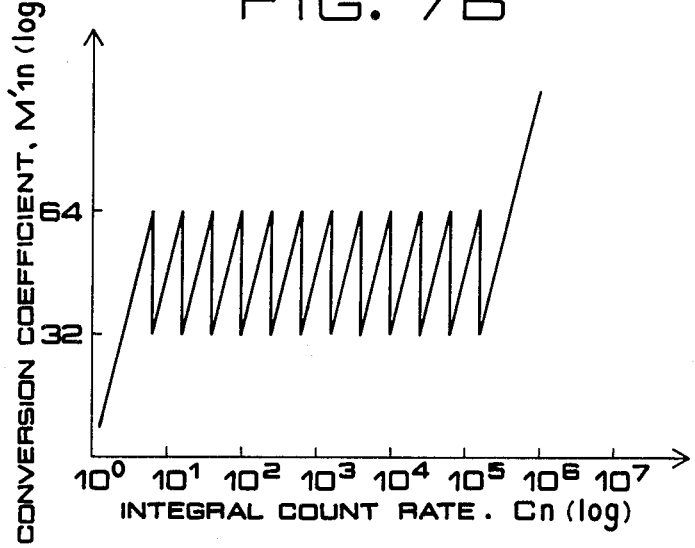

From both integral count value $C_k$, and stored coefficient values $M'_{1k}$, $M_{2k}$ on the converter 7 are obtained through the conversion process diagrammed in the flow chart (FIG. 6), the conversion coefficient value outputs $M_1$, $M_2$ which plot the curves against integral count rates as shown in FIGS. 7(A) and (B), respectively.

The conversion process diagrammed in FIG. 6 which is composed of branching judgement and addition/subtraction operation, can be carried out by an exponential approach operation at high speeds at proximity of 17 position of the stepped line.

For example, if integral count value Cn amounts to 170, then, from the Table stored on the storage element of the converter in FIG. 8, the second conversion count coefficient value $M_2$ is delivered as 4096, namely the second frequency division value, to the frequency division input of the second frequency divider. At the same time, numeral value "128" is extracted by reference to $M_{1k}$, subtraction: $Cn - M'_{1k}$, (=170−128=42) is made, then the result 42 (the first submultiple value) being delivered as the first conversion coefficient value to the frequency-division input of the first frequency divider. This would be apparent from the flow chart (FIG. 6) and FIGS. 7(A) and (B) (Integral count rate, Cn, conversion coefficients, $M_{1n}$ and $M_{2n}$, characteristics, respectively.) The next frequency divider 6 outputs at the divider pulse frequency $F_B$ given by $$F_B = F_S \cdot \frac{(C_K - M_{1K})}{M_{2K}} \cdot K_D$$

wherein $K_D$ is frequency divider constant. Thus, if $F_S = 10^7$ cpm, then $F_B$ amounts to approximately 100 cpm, and possible to get equal to input count rate $F_I$.

The above-mentioned conversion process (FIG. 6) can be easily realized with an integrated circuit such as microprocessor. Likewise, the integrator 5 and the pulse generator 2A can be incorporated in the means. It is noted the integrator 5 operates as software counter.

With the aid of a storage element (RAM) in addition to this, input, integration and exponential transformation of count values from the count difference circuit can be executed in accordance with a program.

The above-described example is of 17 steps in the conversion coefficient table, and the number of coefficients stored changes with requirement value for approximation accurcy.

Moreover count rate to time constant characteristic not necessary limited as in the above-described example, but combination of the characteristics of the constant $\sigma$ and constant $\tau$ can be changed depending on use. Instead of using $\sigma$:10% conversion coefficient table as in the above-described example, also other values may be composed.

As described above, the digital count ratemeter according to the invention comprises (A) a count difference circuit for adding input pulse signals, subtracting frequency of divider pulse and accumulating pulse count values every unit time, (B) an integrator for receiving and integrating the positive or negative numbers of accumulated pulse counts of the count difference circuit, and (C) a feedback unit consisting of a converter for converting integral count value of the integrator into frequency division ratio and a frequency divider for submultiplying the reference pulse frequency from reference pulse generator in dependence on the frequency division ratio output of the converter and generating a divider pulse, and adapted for transforming a divider pulse by the use of exponential function of the integral count value and delivering the transformed result, whereby a fixed measurement accuracy in the overall count rate range is attained.

In addition, if the count difference circuit is one having count capacity of accumulating output incoming pulses per unit time, or is constructed so that it causes the generation of carry and borrow signals when count quantity accumulated during unit time gets beyond the positive or negative counting capacity, and thereby provokes the succeedingly-connected integrator to non-periodically operate for accumulation, then effective digits in a wide count rate range could be realized, and will be free from the necessity to speed up all the operations on hardware, with consequent reduced burden.

What is claimed is:

1. A digital count ratemeter comprising:
a count difference circuit for adding input pulse signals, subtracting frequency of divider pulse and accumulating pulse count values every unit time;
an integrator for receiving and integrating the positive and negative the numbers of accumulated pulse counts of said count difference circuit; and
a feedback unit including a converter for converting integral count value of the integrator into frequency division ratio and a frequency divider for submultiplying the reference pulse frequency from reference pulse generator in dependence on the frequency division ratio output of the converter and generating a divider pulse, and adapted for transforming a divider pulse by the use of exponential function of the integral count value and delivering the transformed result.

2. A digital ratemeter as defined in claim 1 wherein said frequency divider comprises a first frequency divider member for submultiplying the divider pulse frequency in accordance with increase in the frequency-division ratio of a converter output and a second frequency divider member for multiplying the divider pulse frequency in accordance with increase in said frequency-division ratio of a converter output, said first and second frequency-divider members being connected in series.

3. A digital ratemeter as defined in claim 1 wherein said feedback unit includes a converter for outputting the first frequency-division value and the second frequency-division value from the storage table on the basis of integrated count value.

4. A digital ratemeter as defined in claim 3 wherein said frequency divider comprises a first frequency divider member outputting at a frequency proportional to the reciprocal of said first frequency-division value, and a second frequency divider member outputting at a frequency proportional to said second frequency-division value.

5. A digital ratemeter as defined in claim 3 wherein said count difference circuit has a counting capacity of accumulating pulses incoming during an unit time.

6. A digital ratemeter as defined in claim 3 wherein said count difference circuit includes means for the generation of carry and borrow signals when count quantity accumulated during unit time gets beyond the positive or negative counting capacity, and thereby provokes the succeedingly-connected integrator to non-periodically operate for accumulation.

* * * * *

UNITED STATES PATENT AND TRADEMARK OFFICE
CERTIFICATE OF CORRECTION

PATENT NO. : 4,618,969

DATED : October 21, 1986

INVENTOR(S) : Shinji Badono et al.

It is certified that error appears in the above-identified patent and that said Letters Patent is hereby corrected as shown below:

Column 5, line 6, equation (8), delete the symbol "$\Delta$".

Column 8, line 9, after "characteristic" insert --is--.

Signed and Sealed this

Twenty-fourth Day of February, 1987

*Attest:*

DONALD J. QUIGG

*Attesting Officer*   *Commissioner of Patents and Trademarks*